United States Patent
Dautet et al.

(10) Patent No.: US 8,368,159 B2
(45) Date of Patent: Feb. 5, 2013

(54) PHOTON COUNTING UV-APD

(75) Inventors: Henri Dautet, Greenfield Park (CA); Martin Couture, Vaudreuil-Dorion (CA)

(73) Assignee: Excelitas Canada, Inc., Vaudreuil (CA)

( * ) Notice: Subject to any disclaimer, the term of this patent is extended or adjusted under 35 U.S.C. 154(b) by 15 days.

(21) Appl. No.: 13/179,378

(22) Filed: Jul. 8, 2011

(65) Prior Publication Data

US 2013/0009265 A1     Jan. 10, 2013

(51) Int. Cl.
*H01L 31/107* (2006.01)
(52) U.S. Cl. .......................... 257/438; 438/91
(58) Field of Classification Search ............ 257/48; 438/91
See application file for complete search history.

(56) References Cited

U.S. PATENT DOCUMENTS

| | | | |
|---|---|---|---|
| 4,127,932 A | | 12/1978 | Hartman et al. |
| 4,326,211 A | * | 4/1982 | Smeets ................ 257/438 |
| 4,816,890 A | * | 3/1989 | Ouchi et al. ............ 257/186 |
| 5,021,854 A | | 6/1991 | Huth |
| 5,343,055 A | * | 8/1994 | Davis et al. ............ 438/91 |
| 5,352,628 A | * | 10/1994 | Funaba ................ 438/508 |
| 5,763,903 A | * | 6/1998 | Mandai et al. ........... 257/186 |
| 5,923,071 A | * | 7/1999 | Saito .................... 257/458 |
| 6,015,721 A | * | 1/2000 | Kim .................... 438/91 |
| 6,136,667 A | | 10/2000 | Hui et al. |
| 6,229,162 B1 | | 5/2001 | Watanabe |
| 6,294,414 B1 | * | 9/2001 | Levine ................. 438/183 |
| 6,492,239 B2 | * | 12/2002 | Yang et al. ............ 438/380 |
| 6,525,305 B2 | | 2/2003 | Deschamps et al. |
| 6,548,878 B1 | | 4/2003 | Nauleau et al. |
| 6,583,482 B2 | * | 6/2003 | Pauchard et al. ......... 257/438 |

(Continued)

FOREIGN PATENT DOCUMENTS

| | | |
|---|---|---|
| EP | 0697743 A1 | 2/1996 |
| JP | 63-215084 A | 9/1988 |

(Continued)

OTHER PUBLICATIONS

Non Final Office Action received for U.S. Appl. No. 11/725,661, mailed on Jun. 29, 2011, 14 pages.

(Continued)

*Primary Examiner* — N Drew Richards
*Assistant Examiner* — Ankush Singal
(74) *Attorney, Agent, or Firm* — Peter A. Nieves; Sheehan Phinney Bass + Green PA

(57) ABSTRACT

An avalanche photodiode (APD) has a first semiconductor substrate having a first doping type. A first semiconductor layer is on top of the first semiconductor substrate. The first semiconductor layer is doped with the first doping type. A second epitaxial layer is on top of the first semiconductor layer. The second epitaxial layer is in-situ doped with the first doping type at a concentration higher than a concentration of the first doping type in the first semiconductor layer. A third epitaxial layer is on top of the second epitaxial layer. The third epitaxial layer is in-situ doped with a second doping type. The doping of the third epitaxial region forms a first p-n junction with the doping of the second epitaxial layer, wherein a carrier multiplication region includes the first p-n junction, and wherein the third epitaxial layer forms an absorption region for photons. A first implanted region is within the third epitaxial layer. The implanted region is doped with the second doping type.

34 Claims, 12 Drawing Sheets

U.S. PATENT DOCUMENTS

| | | | |
|---|---|---|---|
| 6,690,078 | B1 | 2/2004 | Irissou et al. |
| 6,943,051 | B2 | 9/2005 | Augusto et al. |
| 7,192,841 | B2 | 3/2007 | Wei et al. |
| 7,759,623 | B2 | 7/2010 | Teshima et al. |
| 7,834,379 | B2 * | 11/2010 | Pan et al. ............... 257/185 |
| 7,994,553 | B2 * | 8/2011 | Yoon et al. .............. 257/292 |
| 8,008,741 | B2 * | 8/2011 | Yamamura et al. ...... 257/438 |
| 8,030,728 | B2 * | 10/2011 | Iwai et al. ............... 257/459 |
| 2001/0035540 | A1 | 11/2001 | Sugiyama et al. |
| 2002/0001911 | A1 * | 1/2002 | Yang et al. ............. 438/380 |
| 2002/0066938 | A1 * | 6/2002 | Pauchard et al. ........ 257/461 |
| 2003/0178636 | A1 * | 9/2003 | Kwan et al. ............. 257/186 |
| 2004/0108530 | A1 * | 6/2004 | Sandvik et al. .......... 257/290 |
| 2004/0188793 | A1 * | 9/2004 | Lindemann et al. ..... 257/457 |
| 2004/0251483 | A1 * | 12/2004 | Ko et al. ................. 257/292 |
| 2005/0104086 | A1 * | 5/2005 | Kuhara et al. ........... 257/186 |
| 2005/0133838 | A1 * | 6/2005 | Son et al. ................ 257/292 |
| 2005/0205930 | A1 * | 9/2005 | Williams, Jr. ........... 257/347 |
| 2005/0253132 | A1 | 11/2005 | Marshall et al. |
| 2007/0243656 | A1 * | 10/2007 | Son et al. ................ 438/72 |
| 2007/0267653 | A1 * | 11/2007 | Yoneda et al. .......... 257/186 |
| 2008/0012087 | A1 | 1/2008 | Dautet et al. |
| 2008/0012104 | A1 | 1/2008 | Pauchard et al. |
| 2009/0008739 | A1 * | 1/2009 | Bae et al. ................ 257/463 |
| 2009/0026494 | A1 * | 1/2009 | Itzler ....................... 257/186 |
| 2009/0121305 | A1 * | 5/2009 | Pan et al. ................ 257/436 |
| 2009/0146238 | A1 * | 6/2009 | Yoon et al. .............. 257/438 |
| 2010/0108893 | A1 | 5/2010 | Flitsch et al. |
| 2010/0148040 | A1 | 6/2010 | Sanfilippo et al. |
| 2010/0148216 | A1 * | 6/2010 | Nakaji et al. ............ 257/184 |
| 2010/0301441 | A1 * | 12/2010 | Pan et al. ................ 257/437 |
| 2010/0301442 | A1 * | 12/2010 | Iwai et al. ............... 257/437 |
| 2011/0024768 | A1 * | 2/2011 | Veliadis .................. 257/77 |
| 2011/0062544 | A1 * | 3/2011 | Iwai ........................ 257/463 |
| 2011/0140168 | A1 * | 6/2011 | Sim et al. ................ 257/186 |
| 2011/0241149 | A1 * | 10/2011 | Mazzillo et al. ........ 257/438 |

FOREIGN PATENT DOCUMENTS

| | | |
|---|---|---|
| JP | 3-231476 A | 10/1991 |
| JP | 8-111542 A | 4/1996 |
| JP | 2000-174325 A | 6/2000 |
| JP | 2000-252512 A | 9/2000 |
| JP | 2001-313415 A | 11/2001 |
| WO | 2009018872 A1 | 2/2009 |
| WO | 2011071483 A1 | 6/2011 |

OTHER PUBLICATIONS

Non Final Office Action received for U.S. Appl. No. 11/725,661, mailed on Dec. 16, 2009, 12 pages.

Final Office Action received for U.S. Appl. No. 11/725,661, mailed on Aug. 17, 2010, 13 pages.

International Search Report and Written Opinion received for PCT Patent Application No. PCT/CA2007/000650, mailed on Aug. 9, 2007, 7 pages.

International Preliminary Report on Patentability received for PCT Patent Application No. PCT/CA2007/000650, issued on Oct. 22, 2008, 6 pages.

Extended European Search Report received for European Patent Application No. 07719577.4, mailed on Jul. 6, 2011, 8 pages.

Office Action received for European Patent Application No. 07719577.4, mailed on Jul. 25, 2011, 1 page.

Office Action received for Japanese Patent Application No. 2009-505690, mailed on Jul. 12, 2011, 6 pages (3 pages of English Translation and 3 pages of Office Action).

* cited by examiner

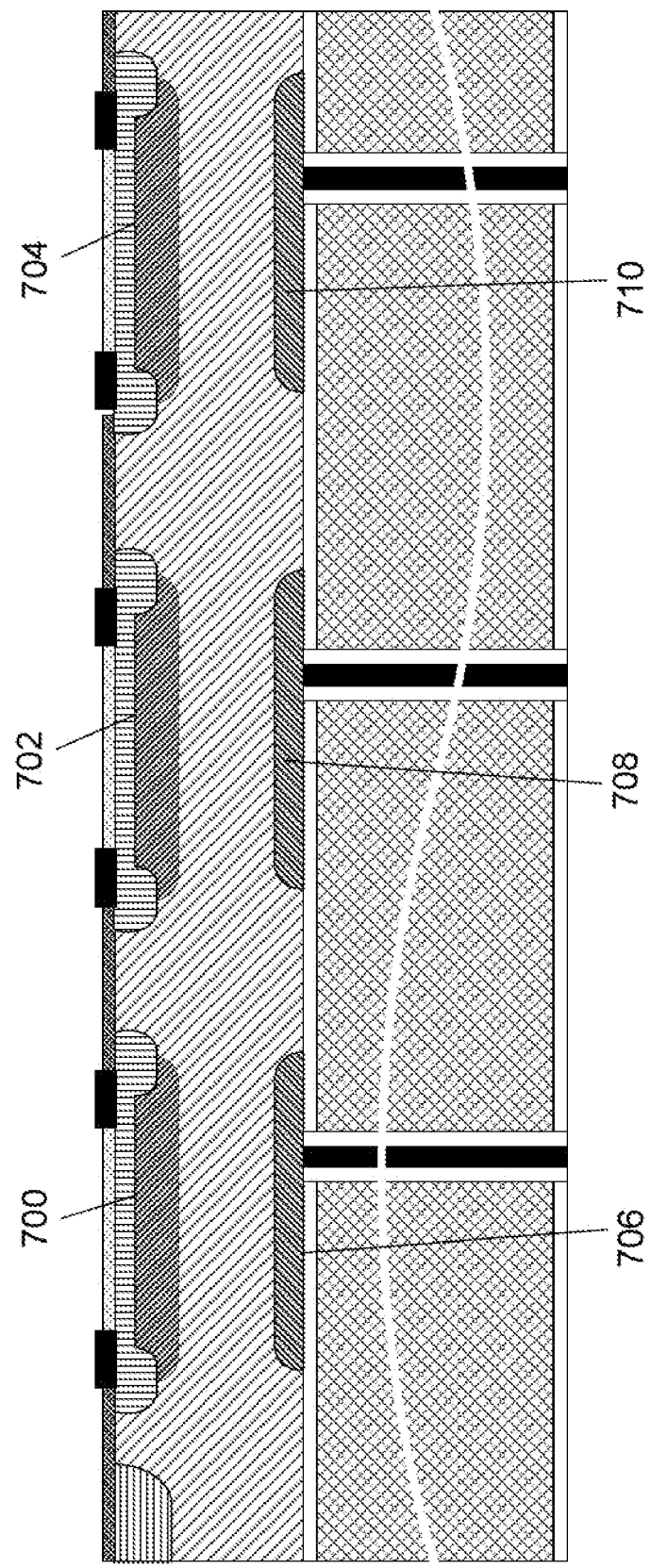

PHOTON COUNTING UV-APD

BACKGROUND

1. Field

The present disclosure relates generally to avalanche photo diodes (APD), and more specifically to APDs used in arrayed devices.

2. Description of Related Art

An APD is a semiconductor photodetector that turns light into an electrical signal. A basic APD has two main regions: an absorption region and a multiplication region. Depending on the APD design, the absorption region may be on one side only of the multiplication region or on both sides. Photons that are absorbed in the absorption region generate an electron-hole pair. The electron (if absorption region is p-type) drifts or is carried by a low-level electric field to the multiplication region. The strong electric field in the multiplication region accelerates the electron to a point where the electron has enough energy to generate more electron-hole pairs through impact ionization within the multiplication region. Depending on the semiconductor and APD design, electrons, holes, or both that reach the multiplication region may be accelerated to the point that they may create additional electron-holes pairs. This process may continue indefinitely or until all carriers are swept out of the multiplication region without generation of additional carriers. Through this process of impact ionization, one electron-hole pair may generate hundreds or thousands more (or significantly more) electron-holes pairs. As the electrons and holes reach the terminals, an electrical current is generated, which may be detected and measured.

The number of electron-holes pairs generated from a single absorbed photon (i.e., the APD gain) varies based on the design and operating point of the APD. There are two main modes of operation for APDs: analog mode and Geiger mode.

In analog mode, the gain of the APD is a function of the APD structure and the reverse bias applied to the APD. Typically, the higher the reverse bias, the higher the gain. For example, an APD may exhibit a gain of 20 at 125V and a gain of 300 at 185V. Gains of up to 1000 or more are possible depending on the materials, the manufacturing process, and the design of the APD. Note that in analog mode, the electrical field in the multiplication region is not strong enough to create electron-hole pairs indefinitely. Eventually all of the carriers will be swept out of the device and the current will drop to zero until another photon generates an electron that reaches the multiplication region.

In Geiger mode, the APD is reverse biased higher than in analog mode and above the APD breakdown voltage. The reverse bias creates a very strong electric field that may result in a gain of $10^5$ or $10^6$ or the impact ionization process described above may even "latch" the APD and become self-sustaining. If the process becomes self-sustaining, then as long as the electric field is maintained, electron-hole pairs will continue to be generated and a current will continue to flow through the APD.

In addition to the operational mode of the APD, the reverse bias applied to the APD may also determine the probability of a generated electron or hole creating a detectable signal through an impact ionization process. In some APDs, the reverse bias may be set to reduce the probability of one carrier (e.g, a hole) triggering the APD as compared to the probability of the other carrier (e.g., an electron) triggering the APD.

If a photon generates a self-sustaining impact ionization process, either by a generated electron or hole, an APD may use a quench to reset itself. In particular, the APD may use a passive or active quench.

A passive quench may be implemented with a high value resistor connected in series between the cathode or the anode of the APD and the voltage source supplying the reverse bias to the APD. Once a photon generates an electron that triggers a self-sustaining impact ionization process in the multiplication region, a current starts to flow through the APD. The current will cause a significant voltage drop through the high value resistor. The voltage drop across the high value resistor will reduce the electric field in the multiplication region, which will reduce the chance that electrons and holes in the multiplication region will create additional electrons-hole pairs. Once the electric-field drops low enough, the impact ionization process will terminate and the APD will reset because the high value resistor will no longer have a voltage drop across it.

An active quench uses a quench circuit to detect a latched APD. Once the quench circuit detects that the APD has latched, the circuit may disconnect the APD from the voltage source or reduce the reverse bias being applied to the APD. Either of these actions will reduce the electric field in the multiplication region. Once the electric field drops low enough, the self-sustaining impact ionization process will terminate and the APD will stop conducting. The quench circuit may then restore the reverse bias to the APD to reset the APD for the next photon.

Other than the gain, there are several other important parameters that describe the performance of an APD. For example, quantum efficiency is the probability that a photon will generate an electron-hole pair in the absorption region and the electron or hole will reach the multiplication region and initiate an impact ionization process that does not terminate prematurely. Dark counting rate is the rate at which non-photon generated carriers initiate the impact ionization process. It is impossible to differentiate these signals from those generated by photons.

In addition to using APDs as individual discrete devices, multiple APDs may be used in integrated arrays. Arrayed APDs may be useful in, for example, imaging applications. A silicon photomultiplier (SiPM) is an example of a device using an array of APDs. In arrays of APDs, each APD may be known as a pixel of the array.

In addition to the performance parameters of the individual APDs, other performance parameters may be relevant to arrayed APDs. For example, cross-talk is the probability that an impact ionization process in one APD will trigger an impact ionization process in a neighboring APD.

Additional descriptions of APDs may be found in U.S. Pat. No. 7,759,623 and U.S. patent application Ser. No. 11/725,661, filed Mar. 20, 2007, published as US Patent Publication No. 2008/0012087 assigned to the assignee of the present invention, both of which are incorporated herein by reference in their entirety for all purposes.

BRIEF SUMMARY

An exemplary embodiment of an avalanche photodiode (APD) has a first semiconductor substrate having a first doping type. A first semiconductor layer is on top of the first semiconductor substrate. The first semiconductor layer is doped with the first doping type. A second epitaxial layer is on top of the first semiconductor layer. The second epitaxial layer is in-situ doped with the first doping type at a concentration higher than a concentration of the first doping type in the first semiconductor layer. A third epitaxial layer is on top of the second epitaxial layer. The third epitaxial layer is in-situ doped with a second doping type. The doping of the third epitaxial region forms a first p-n junction with the doping of the second epitaxial layer, wherein a carrier multiplication region includes the first p-n junction, and wherein the third epitaxial layer forms an absorption region for photons. A first implanted region is within the third epitaxial layer. The implanted region is doped with the second doping type.

DESCRIPTION OF THE FIGURES

FIG. 7 depicts a cross-section of the 5×5 array of APDs.

DETAILED DESCRIPTION

The following description is presented to enable a person of ordinary skill in the art to make and use the various embodiments. Descriptions of specific devices, techniques, and applications are provided only as examples. Various modifications to the examples described herein will be readily apparent to those of ordinary skill in the art, and the general principles defined herein may be applied to other examples and applications without departing from the spirit and scope of the various embodiments. Thus, the various embodiments are not intended to be limited to the examples described herein and shown, but are to be accorded the scope consistent with the claims.

The discussion below refers to exemplary embodiments of APDs made of silicon and having a p-type absorption region (e.g., doped with boron) designed for detecting photons with a wavelength of 400-500 nm. However, those skilled in the art will recognize that the concepts discussed below may apply equally to other semiconductors (e.g., Ge or InGaAs), other doping schemes (e.g., using an n-type absorption region), and to detecting other wavelengths.

FIGS. 1A-1E depict a first embodiment of an APD at various stages during an exemplary process for fabricating an APD. While FIGS. 1A-1E depict a single APD device on a substrate, it should be understood that during manufacturing many APDs are manufactured together on a single substrate or wafer. Additionally, the discussion below does not cover every step necessary to fabricate an APD. Those skilled in the art will recognize other necessary steps to fabricate an APD.

Figure 1A:
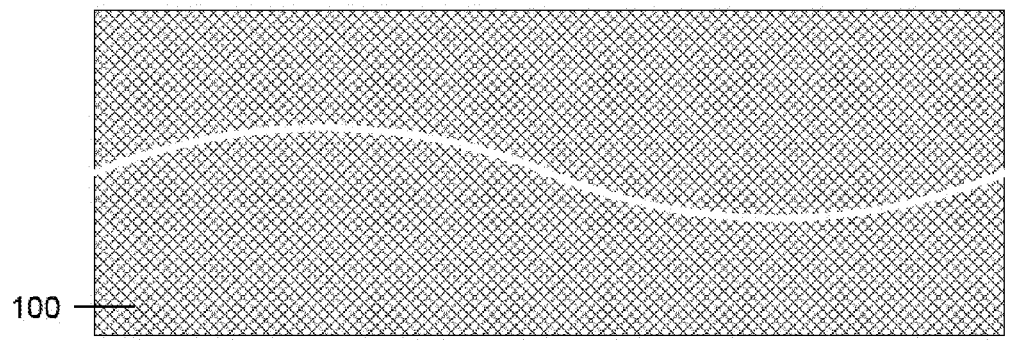
FIGS. 1A-1F depict various stages of an exemplary process for fabricating a first embodiment of an APD.

The first step of the exemplary process is providing the starting material. FIG. 1A depicts wafer 100 that forms the substrate for the first embodiment. Wafer 100 may be about 450 μm thick and have n-type doping that results in a resistivity of about 50 mΩ·cm or less. Alternatively, wafer 100 may be about 200 to 500 μm thick and have a doping concentration of about $10^{19}$ cm$^{-3}$ to $10^{20}$ cm$^{-3}$. Other wafer thicknesses, resistivities, and doping types may also be used.

Figure 1B:
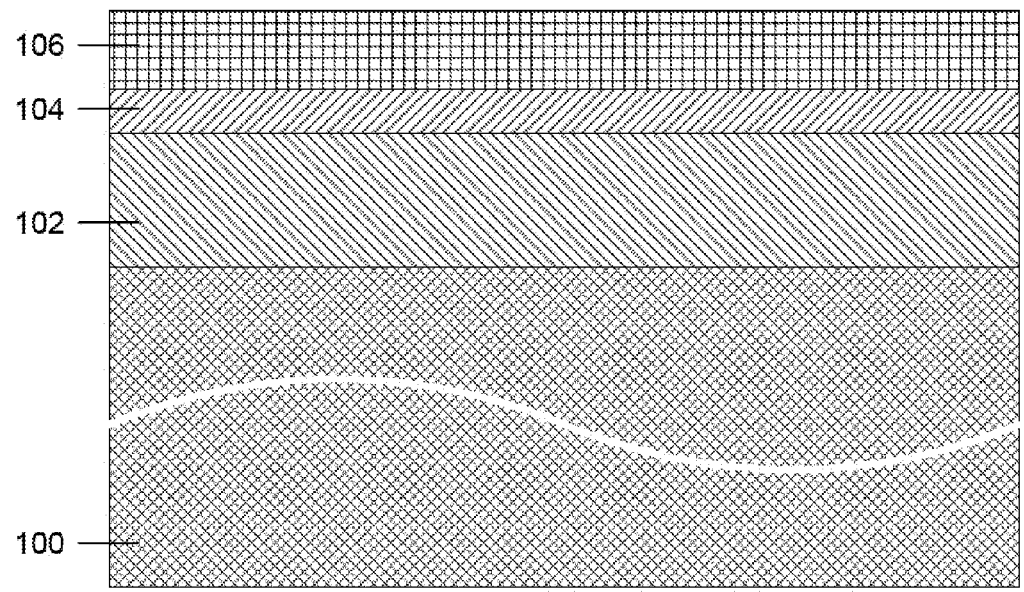

FIG. 1B depicts three expitaxial layers, 102, 104, and 106 grown on top of wafer 100. The thicknesses, doping, and material of layers 102, 104, and 106 (as well as the starting material) may be varied to exclude or include certain wavelengths of photons. In the current embodiment, the APD is designed to use silicon to detect photons with a wavelength of 400-500 nm based on the electrons generated when those photons are absorbed in the silicon. The absorption depth in silicon for these types of photons is less than 1 μm. Additionally, the current embodiment is designed to minimize the APD's response to generated holes. Therefore, the first exemplary embodiment has an absorption region within 1 μm of the surface of the APD in p-type semiconductor. However, in other embodiments designed to detect other wavelengths of photons, the location of the absorption region may be tuned by varying the thickness of layers 102, 104, 106 or the doping of these layers and the starting material. For example, the absorption region may be moved to below the p-n junction between layers 104 and 106 so that other photon wavelengths may be detected. The absorption region may be moved by reversing the doping types of wafer 100 and layers 102, 104, and 106.

Layer 102 spreads the depletion region formed by the p-n junction between layers 106 and 104. By spreading the depletion region, the capacitance of the first embodiment is reduced and the speed at which it operates may be increased. Layer 102 may have the same doping type (n-type) as the starting material and have a resistivity of 50-500 Ω·cm or a doping concentration of about $10^{12}$ cm$^{-3}$ to $10^{15}$ cm$^{-3}$ and a thickness of 10-50 μm. Layer 102 may be in-situ doped during its epitaxial growth.

Layer 104 forms part of a multiplication region. Layer 104 may have the same doping type (n-type) as the starting material and layer 102 and have a resistivity of 2-20 Ω·cm or a doping concentration of about $10^{14}$ cm$^{-3}$ to $10^{16}$ cm$^{-3}$ and a grown thickness of about 3-15 μm. Layer 106 forms an absorption region and part of the multiplication region. Layer 106 may have the opposite doping type (p-type) as the starting material, layer 102, and layer 104 and may have a resistivity of 2-20 Ω·cm or a doping concentration of about $10^{14}$ cm$^{-3}$ to $10^{16}$ cm$^{-3}$ and a grown thickness of 3-15 μm. Layers 104 and 106 may also be in-situ doped during the epitaxial growth. While growing layer 106, the doping from layer 104 may diffuse into layer 106 so that instead of a p-n junction forming at the physical boundary between layers 104 and 106, a p-n junction is formed within layer 106. The junction depth of this p-n junction may be, for example, 1-10 μm below the surface.

The absorption region may be moved to or include the other side of the p-n junction formed by layers 104 and 106. This may tune the APD for specific applications. For example, in the current embodiment, if photon detection is to be based on generated holes in addition to generated electrons, holes generated on the other side of the p-n junction may also trigger the APD if the reverse bias applied to the APD is high enough and the electric field is shaped to allow holes to trigger the APD. Alternatively, the doping of layers 102, 104, and 106, and wafer 100 may be reversed to allow electrons generated below the p-n junction to trigger the APD. This may be useful, for example, to detect other photon wavelengths in silicon.

Proper shaping of the electrical field in the absorption region and multiplication region may also be used to tune the performance of the APD. For example, a proper shape of the electrical field in the absorption region or multiplication region may reduce the probability of the APD being triggered by holes generated in the absorption region or on the other side of the p-n junction, even when the reverse bias applied to the APD is high. This may be useful, for example, when increasing the reverse bias of the APD to increase the probability of a generated electron triggering the APD while maintaining a low probability that a generated hole will trigger the APD.

Layers 102, 104, 106 may all be grown at once in one processing step (i.e., wafer 100 is not removed from the epitaxy chamber until all three layers are grown). Alternatively, the layers may be grown at different times in different epitaxy chambers. For an example of a process that has additional processing steps between the growths of layers 104 and 106, see the discussion of a second embodiment with respect to FIG. 2 below.

Figure 1C:
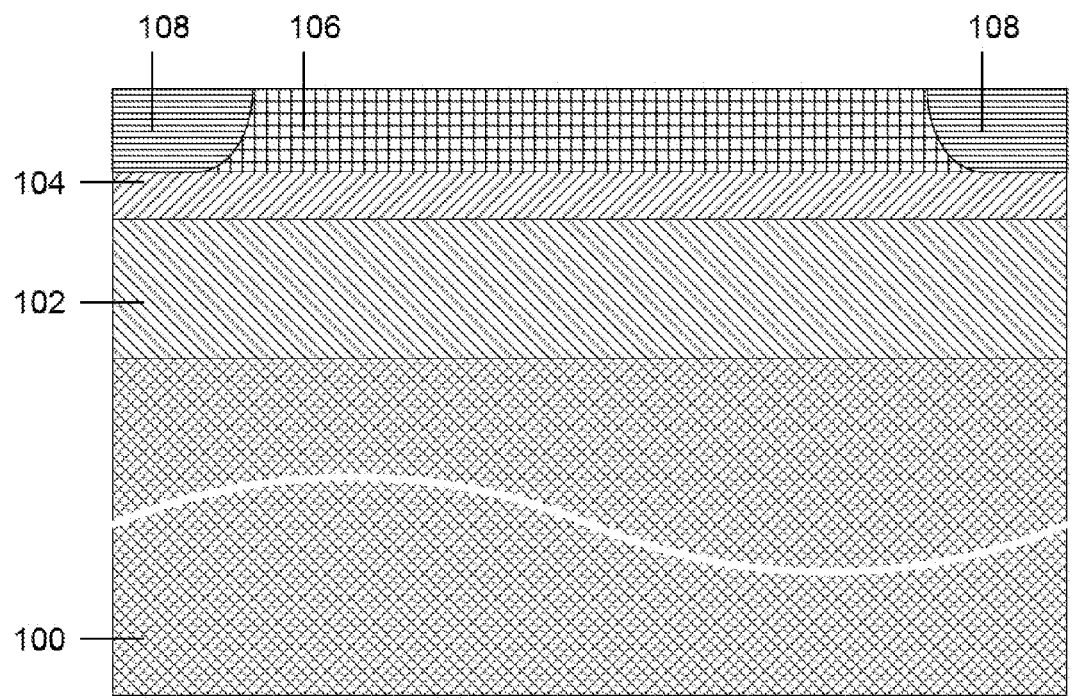

FIG. 1C depicts wafer 100 after channel stop regions 108 have been implanted. These regions may prevent leakage paths. Regions 108 may be the same type of doping as layer 104 (n-type).

Figure 1D:
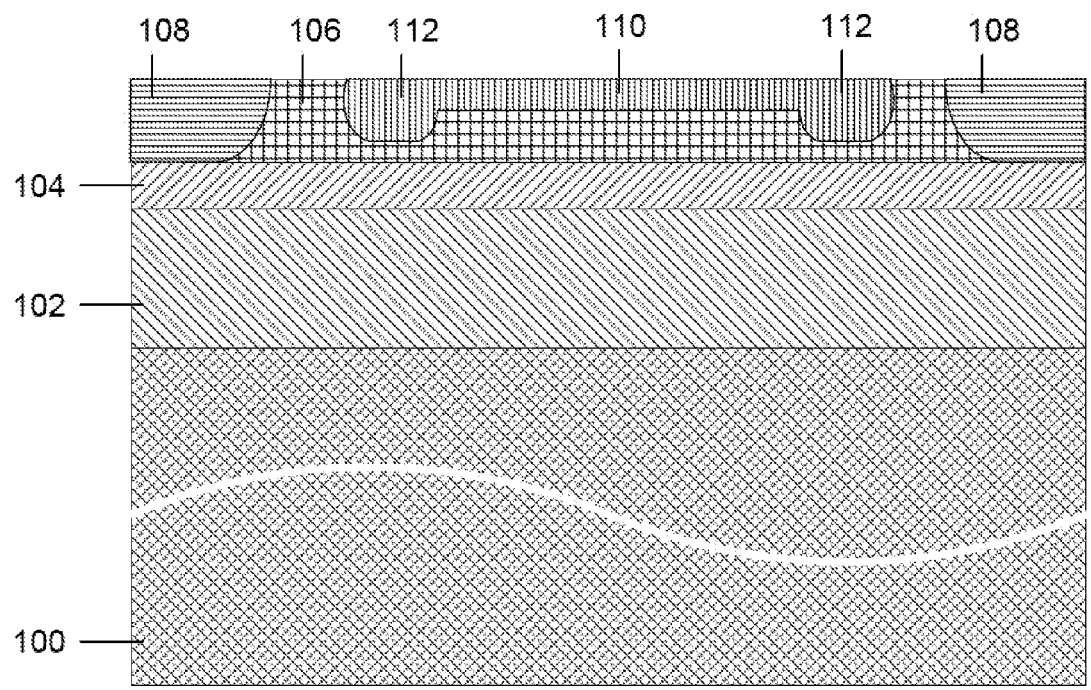

FIG. 1D depicts wafer 100 after one or more implants has formed region 110 in layer 106. This region helps shape the electric field in the multiplication region. Region 110 may be of the same type of doping (p-type) as layer 106. Region 110 may also be formed so as to ensure the multiplication region does not extend to the exposed surface of layer 106. The peak doping in region 110 near the exposed surface of layer 106 may be about $10^{20}$ cm$^{-3}$.

Optional regions 112 at either end of region 110 may further shape the electric field so as to prevent the multiplication region from expanding laterally. If region 112 is included, it may be formed by the same implants that forms 110 or by different implants. For example, the depth of region 112 may be varied independently of the depth of region 110 if the surface of layer 106 above region 112 has a different screen oxide thickness as compared to the surface of layer 106 above region 110.

Figure 1E:
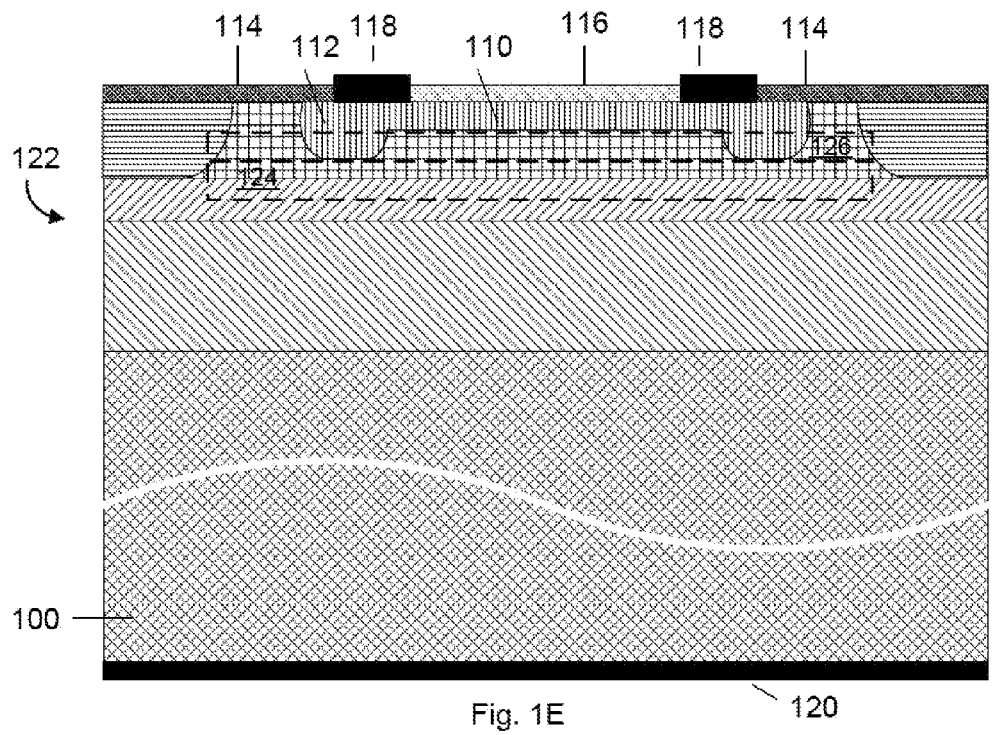

FIG. 1E depicts the first embodiment 122 of an APD after forming anode electrodes 118, cathode electrode 120, insulating layer 114, and anti-reflective coating 116 on wafer 100. Anode electrodes 118 electrically contact regions 110 and 112, and cathode electrode 120 electrically contacts wafer 100. The first embodiment 122 includes absorption region 126 (dotted box) and multiplication region 124 (dotted box). The first embodiment 122 may be from 15-100 μm wide. Again, the first embodiment is designed to detect electrons generated by photons with wavelengths of 400-500 nm in from absorption region 126.

The operation of a device formed as described above is as follows. When a large (e.g., >100V) reverse bias is applied between cathode electrode 120 and anode electrodes 118, a strong electrical field will be formed in the multiplication region around the p-n junction formed by layers 104 and 106. If a photon is absorbed into absorption region 126, it may generate an electron-hole pair. The hole may be swept to anode electrode 118 by a weak electric field. The electron may drift or be swept by the weak electric field to multiplication region 124 where the strong electric field will accelerate it. If the electron gains enough energy, it may generate additional electron-hole pairs through impact ionization in multiplication region 124. These carriers will be separated by the strong electric field and may trigger additional electron-hole pairs through impact ionization before being collected by the electrodes and producing a current. If the reverse bias is large enough and the device is properly designed, this process may be self-sustaining. In some cases, the reverse bias will be high enough to increase the chance that generated electrons will trigger the APD but will keep the probability that a hole will trigger the APD to a minimum.

Figure 1F:
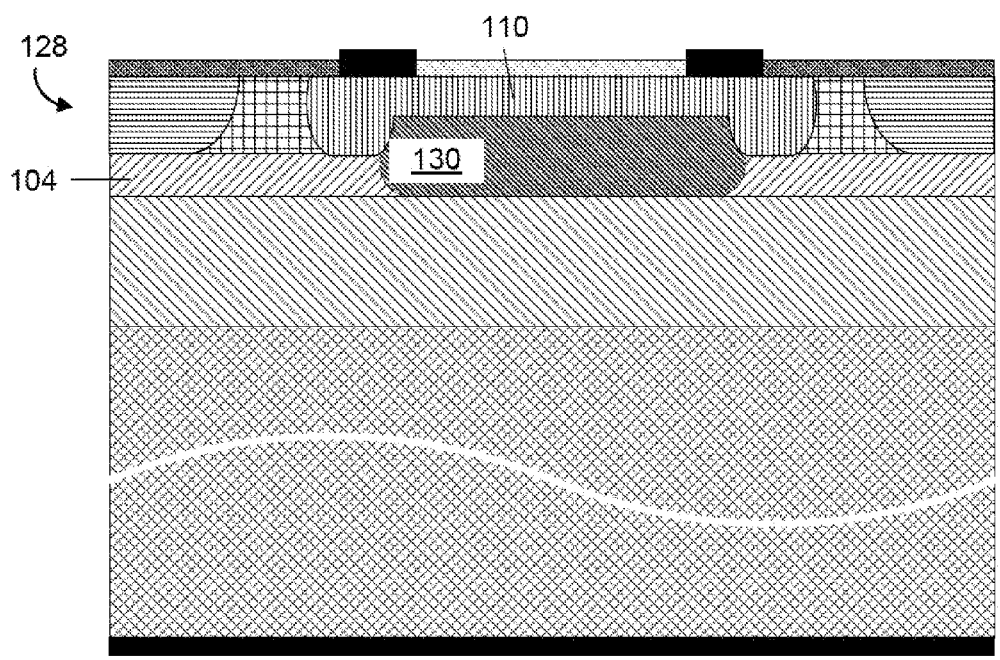

FIG. 1F depicts APD 128, which is a variation of the first embodiment fabricated with a similar process as discussed above with respect to FIGS. 1A-1E. APD 128 is similar to the first embodiment 122 except in APD 128, region 130 further shapes the electric field in the multiplication region. Region 130 may be formed by first implanting into layer 104 prior to the growth of layer 106. If the implant is shallow enough, the implant will diffuse into layer 106 and further into layer 104 as layer 106 is grown.

Region 120 may be of the same doping type (n-type) as the doping of layer 104. In APD 128, because region 120 has shaped the electric field, the multiplication region may be concentrated at the junction of region 110 and region 120.

FIGS. 2A-2D depict several early stages in the fabrication of a second embodiment of an APD according to another exemplary process. The fifth embodiment is similar to the first embodiment except that expitaxial layer 102 (FIG. 1B) of the first embodiment is formed by bonding two wafers together in the fifth embodiment.

Figure 2A:
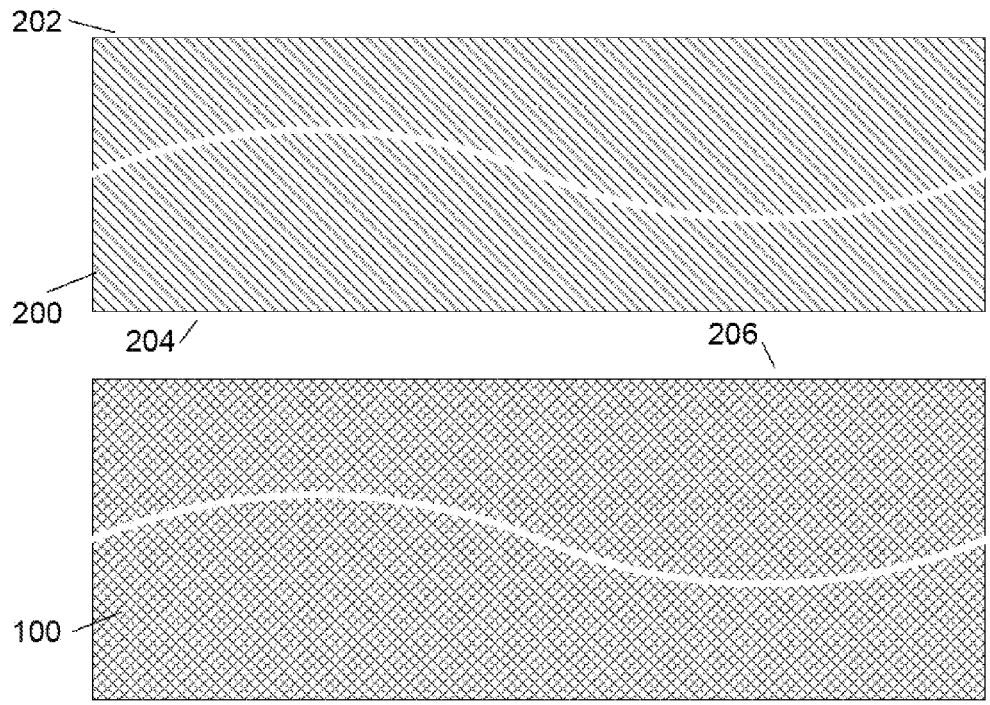
FIGS. 2A-2D depict early stages of another exemplary process for fabricating a second exemplary embodiment of an APD.

In particular, FIG. 2A depicts two wafers 200 and 100. Wafer 100 may be the same wafer 100 as described with respect FIG. 1A and the first embodiment. Wafer 200 may be a wafer of the same doping type as wafer 100 (n-type) and have a resistivity of about 50-500 Ω·cm. Wafer 200 has a top exposed surface 202 and a bottom exposed surface 204. Wafer 100 has a top exposed surface 206.

Figure 2B:
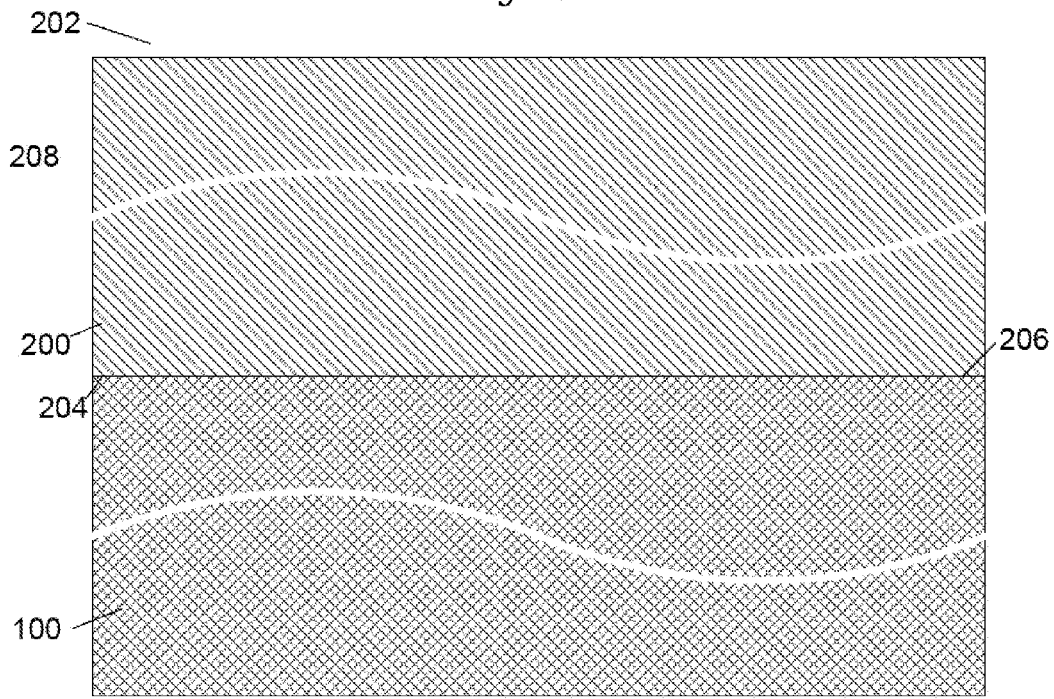

FIG. 2B depicts bonded wafer 208, which is made of wafers 200 and 100 after a wafer bonding process has bonded surface 206 of wafer 100 to surface 204 of wafer 200. The wafer bonding process may, for example, use a non-hydrogenated intermediate layer on one of the wafers along with heat and an applied voltage to create a permanent bond between the two wafers. A further explanation of a wafer bonding process is available in U.S. Pat. No. 7,192,841, which is incorporated herein by reference in its entirety for all purposes.

Figure 2C:
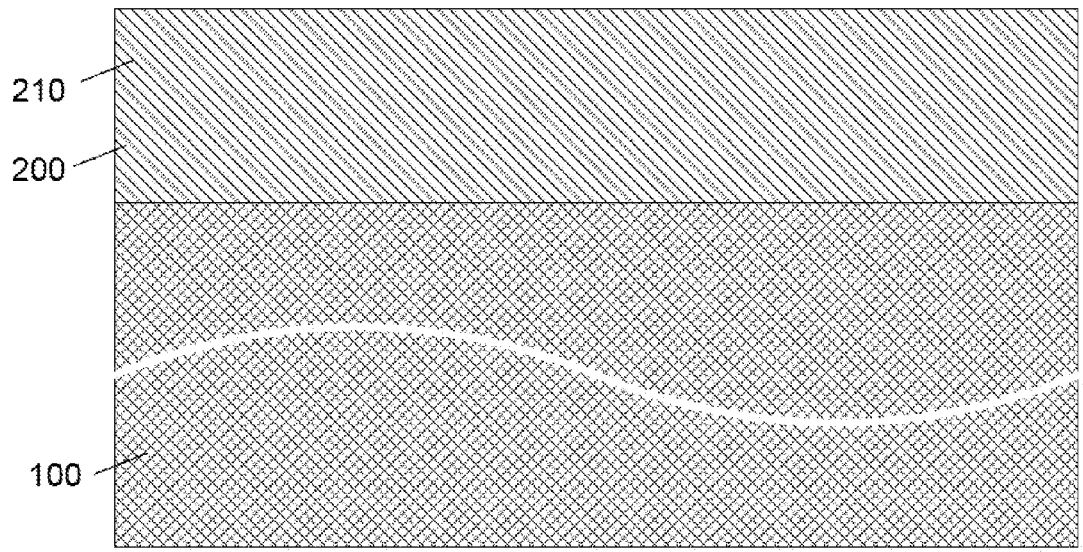

FIG. 2C depicts bonded wafer 208 after wafer 200 has been thinned to a thickness of 10-70 μm through thinning techniques, such as chemical-mechanical polishing (CMP), etch backs, or a combination of both CMP and etch-backs. Top exposed surface 202 (FIG. 2B) has been removed in the thinning process. By thinning wafer 200, layer 210 is formed, which is an analogous layer to layer 102 (FIG. 1B) of the first embodiment.

Figure 2D:
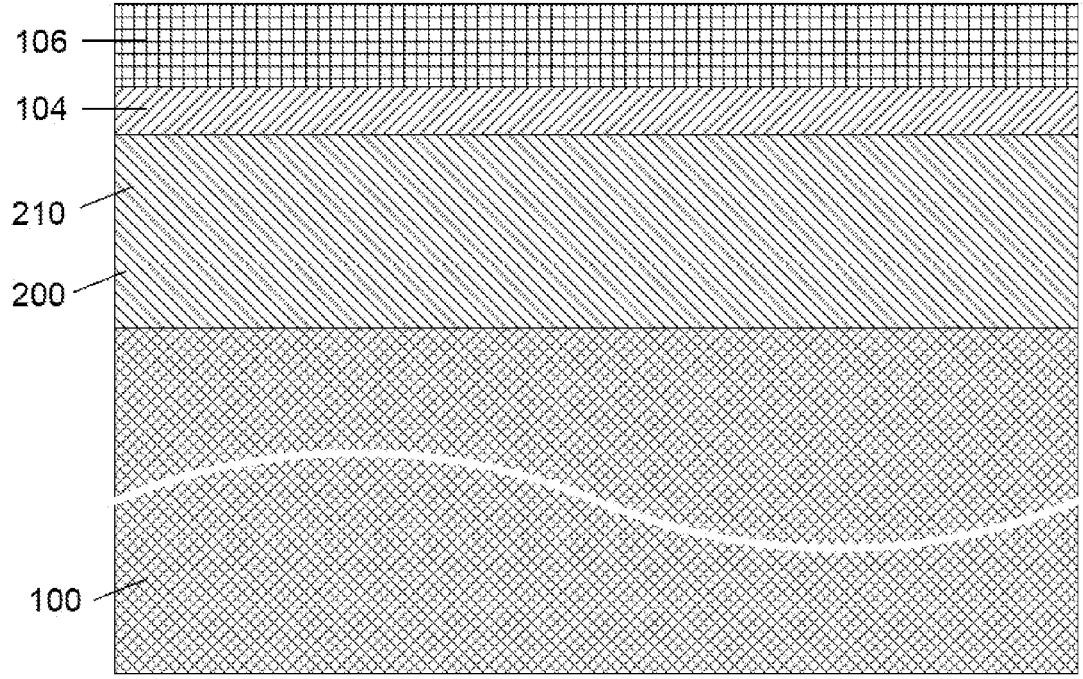

FIG. 2D depicts bonded wafer 208 after expitaxial layers 104 and 106 have been grown on layer 210. Layers 104 and 106 may be the same layers as described with respect to FIG. 1B above. After the stage depicted in FIG. 2D, the processing of bonded wafer 208 may continue as explained above with respect to FIG. 1C-1E or 2.

Figure 2E:
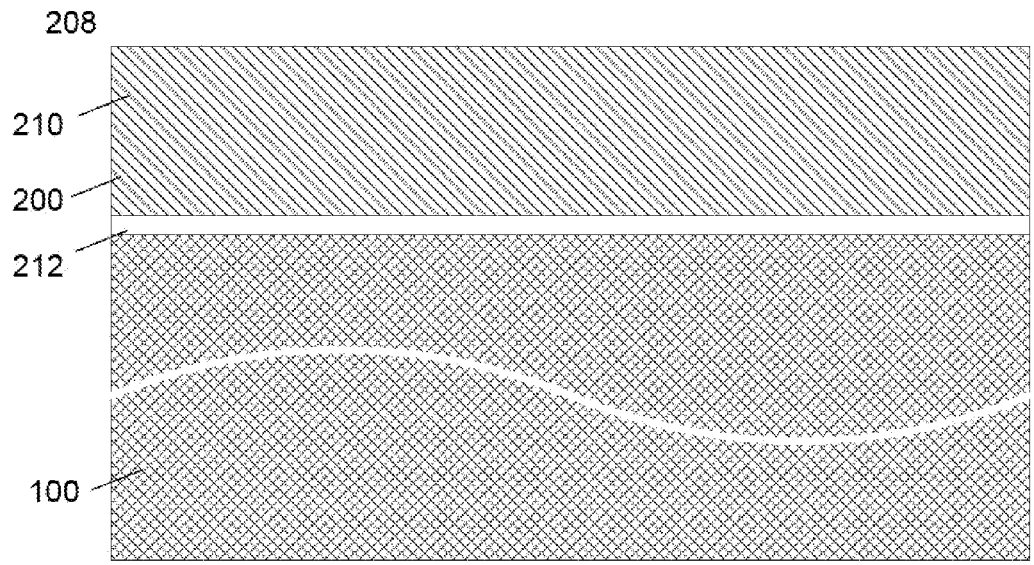
FIGS. 2E-2F depict optional features of the second exemplary embodiment of an APD.
Figure 2F:
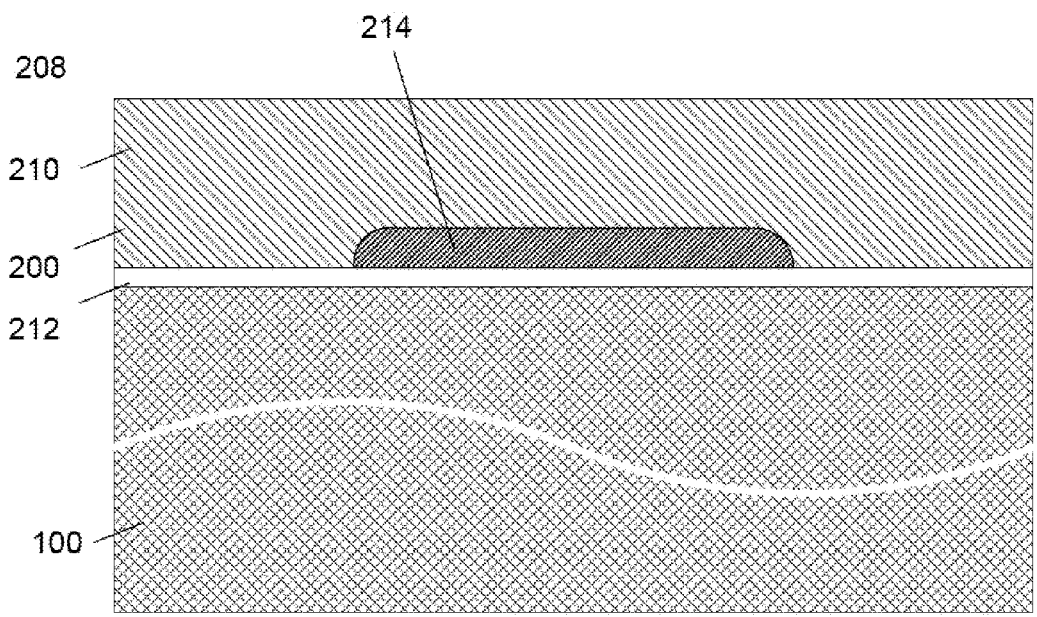

FIGS. 2E and 2F depict optional variations that may be applied to the bonded wafer process described with respect to FIGS. 2A and 2B. In particular, FIG. 2E depicts insulating layer 212 that may be on the surface of wafer 200 or wafer 100 prior to bonding the wafers together. The addition of insulating layer 212 may improve cross-talk performance of arrays of APDs using the fifth embodiment. Arrays of APDs are discussed below with respect to FIGS. 6 and 7. Insulating layer 212 may be, for example, silicon dioxide. FIG. 2F depicts bonded wafer 208 with insulating layer 212 in addition to implant region 214 formed in wafer 200. Implant region 214 may allow for backside contact to individual APDs when arrays of the fifth embodiments are used. Arrays of APDs are discussed below with respect to FIGS. 6 and 7. The formation of implant region 214 is discussed below with respect to FIGS. 3A-3F and implant region 306. By using implant region 214, the backside contact schemes described below with respect to FIGS. 3F and 4 may be used as an alternative to the contact scheme described above with respect to FIG. 1E or below with respect to FIG. 5.

FIGS. 3A-3F depict various stages in the fabrication of a third embodiment of an APD according to another exemplary process. This exemplary process begins by providing wafer 300 of FIG. 3A as the starting material. Wafer 300 may form the majority of the absorption region in the third embodiment. Wafer 300 may be about 450 μm thick and have n-type doping that results in a resistivity of about 10-500 Ω·cm or a doping concentration of about $10^{13}$ cm$^{-3}$ to $10^{16}$ cm$^{-3}$. Wafer 300 also has a frontside 302 and a backside 304. Because the multiplication region and absorption region will be formed in wafer 300, a high quality wafer (e.g., float-zone silicon wafer) may be desirable.

Figure 3A:
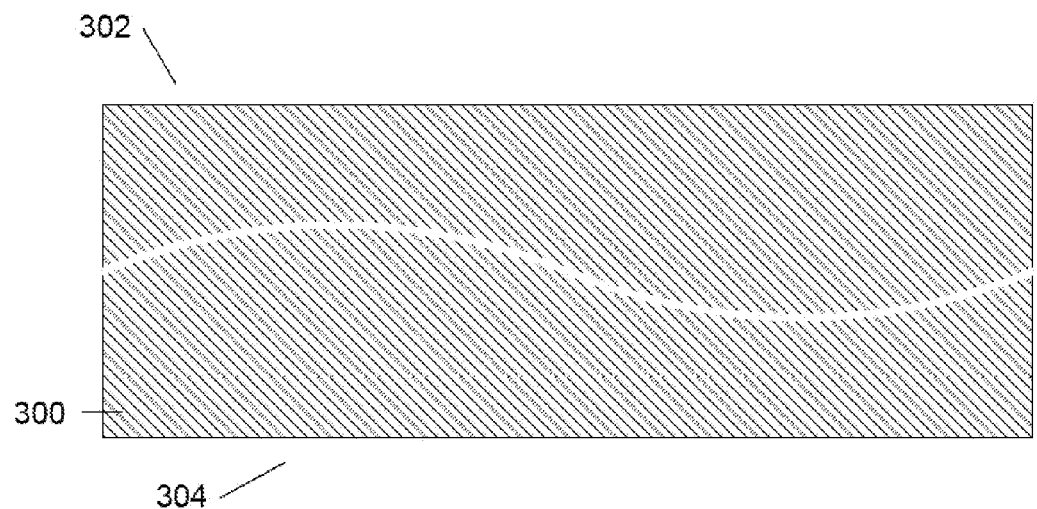
FIGS. 3A-3F depict various stages of another exemplary process for fabricating a third embodiment of an APD.
Figure 3B:
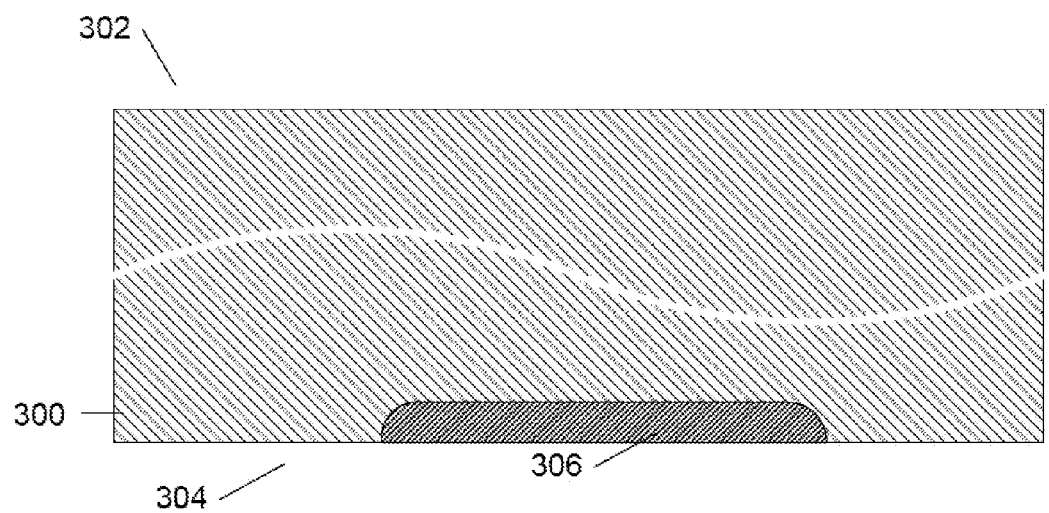

FIG. 3B depicts wafer 300 after implant region 306 has been implanted on backside 304. Implant region 306 will be of the same doping type (n-type) but a higher concentration as compared to wafer 300. For example, implant region 306 may have a peak doping of $10^{16}$ cm$^{-3}$ to $10^{19}$ cm$^{-3}$.

Figure 3C:
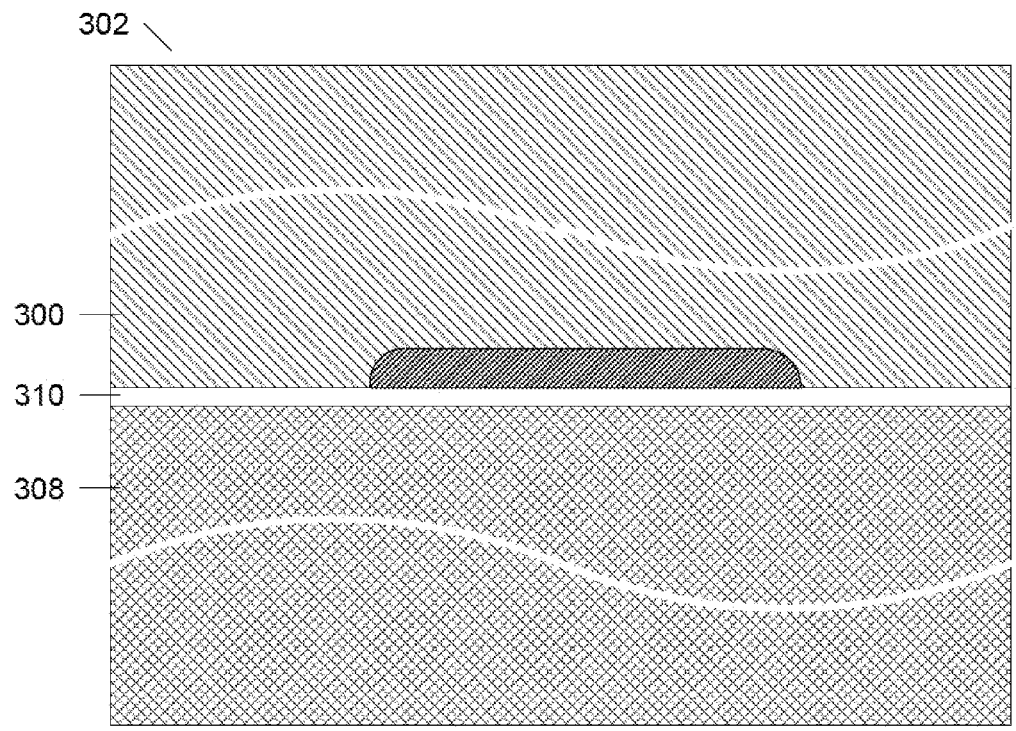

FIG. 3C depicts wafer 300 after handle wafer 308 has been bonded to backside 304 of wafer 300. Insulating layer 310 may be between wafer 300 and handle wafer 308. Insulating layer 310 may be, for example, silicon dioxide. Wafer 300 and handle wafer 308 may be bonded together using well known wafer bonding techniques.

Figure 3D:
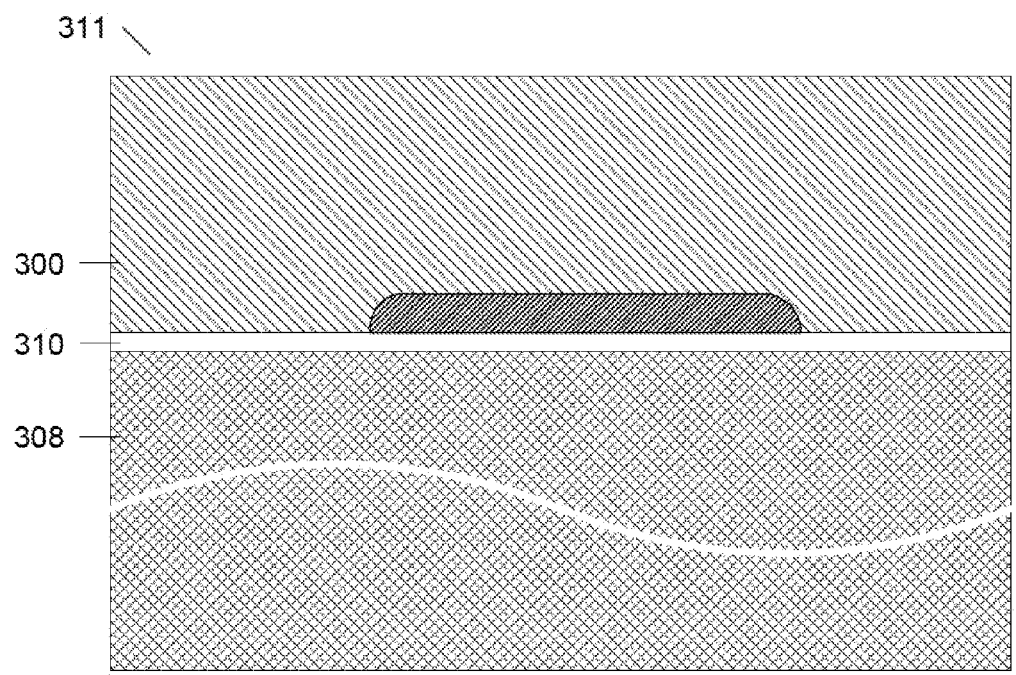

FIG. 3D depicts wafer 300 after it has been thinned to about 85 μm thick, although wafer 300 may be thinned to a thickness of about 10-90 μm. By first bonding wafer 300 to handle wafer 308, the difficulties of processing thinned, brittle wafers may be avoided. Wafer 300 may be thinned by conventional thinning techniques such as grinding, chemical mechanical polishing (CMP), etch back, or a combination of these techniques. Additional processing may be required to return front surface 311 to a high quality silicon surface. For example, a thermal oxidation of front surface 311 may consume any silicon damaged from the thinning process.

Figure 3E:
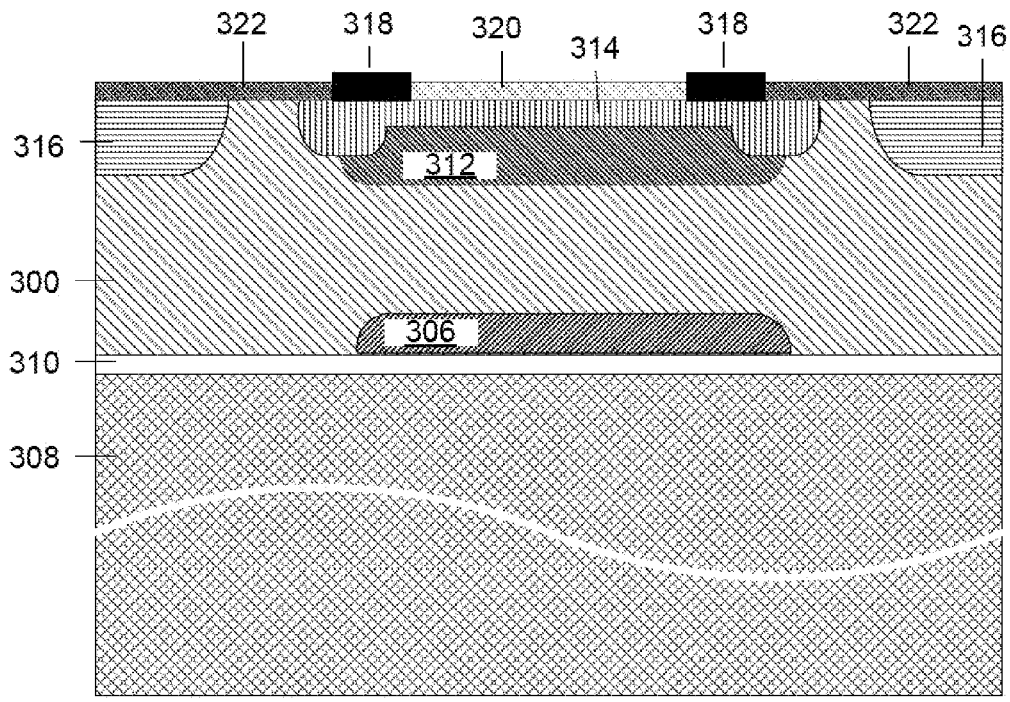

FIG. 3E depicts wafer 300 after several additional process steps. Region 312 is implanted with doping of the same type (n-type) as wafer 300. Region 312 helps shape the electric field in the multiplication region that is at the p-n junction formed by regions 312 and 314. Region 314 is implanted with the opposite type of doping (p-type) as wafer 300. Region 314 is similar to region 110 as discussed above with respect to FIG. 1C. Region 314 forms a top region of the p-n junction formed by regions 312 and 314. The top region is adjacent to the surface of wafer 300. Channel stop regions 316 may be similar to channel stop regions 108 as described above with respect to FIG. 1C. Anode electrodes 318, anti-reflective layer 320, and insulating layer 322 may be similar to anode electrodes 118, anti-reflective layer 114, and insulating layer 116 of FIG. 1E.

As an alternative to the structure as shown in FIG. 3E, the third embodiment could be processed by processing wafer 300 shown in FIG. 3D as described above with respect to FIGS. 1B-1E except the cathode electrode 120 (FIG. 1E) would be omitted unless oxide layer 310 is not present between wafer 300 and handle wafer 308.

Note that features added in FIG. 3E are roughly aligned with implant region 306 so that the p-n junction formed between region 312 and 314 overlaps implant region 306. Regardless of the how the multiplication region and other features are formed in and on wafer 300, there must be some method for aligning these features to implant region 306. For example, alignment may be accomplished by adding backside alignment marks to handle wafer 308 before thinning wafer 300. Other alignment schemes may also be used.

Figure 3F:
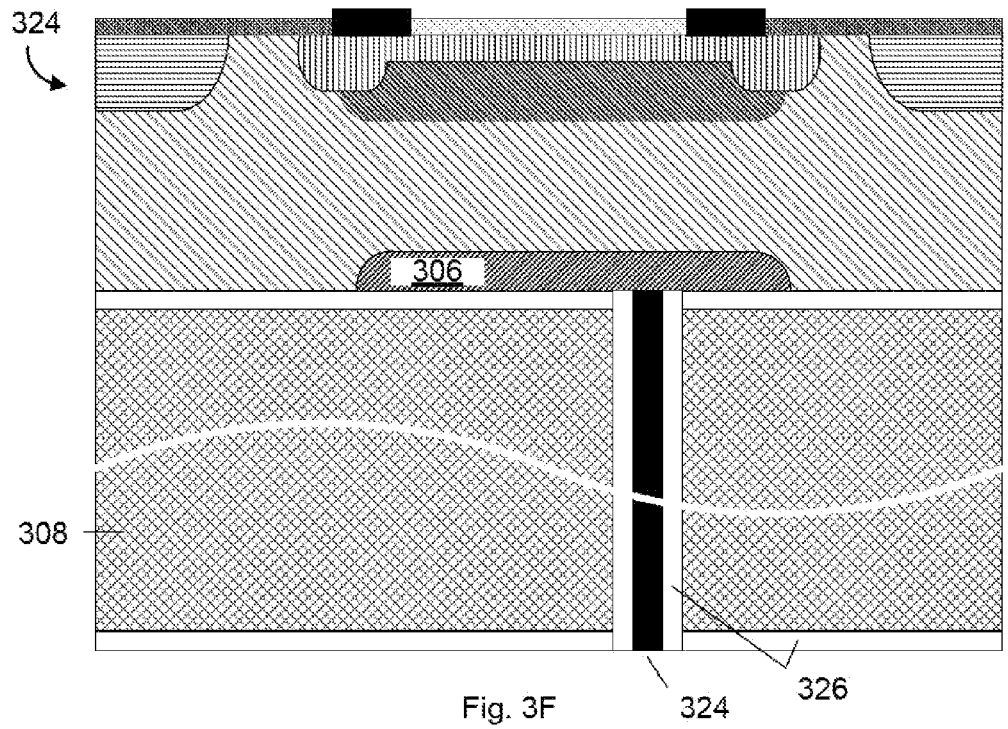

FIG. 3F depicts the third embodiment 324 of an APD. The cathode of the p-n junction may be contacted through via 324 that is formed through handle wafer 308 so that it is contacting implant region 306. A deep reactive-ion etching (DRIE) process may be used to etch the hole for via 324. The hole may then be lined with oxide 326 before filling the hole with a metal plug to form a via.

Figure 4:
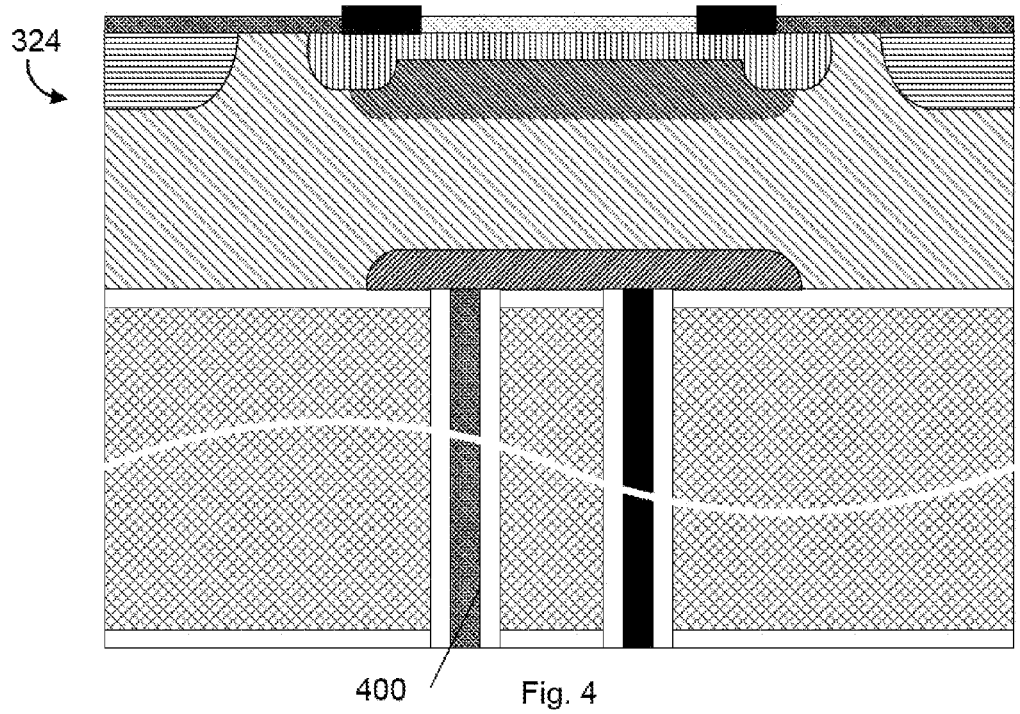
FIG. 4 depicts the third embodiment with a backside contact to the cathode allowing for an passive or active quench to the anode.

FIG. 4 depicts the third embodiment that adds an optional backside via 400. Via 400 may be filled with a high resistance material to act as a passive quench or with a low resistivity material to allow active quenching.

Figure 5:
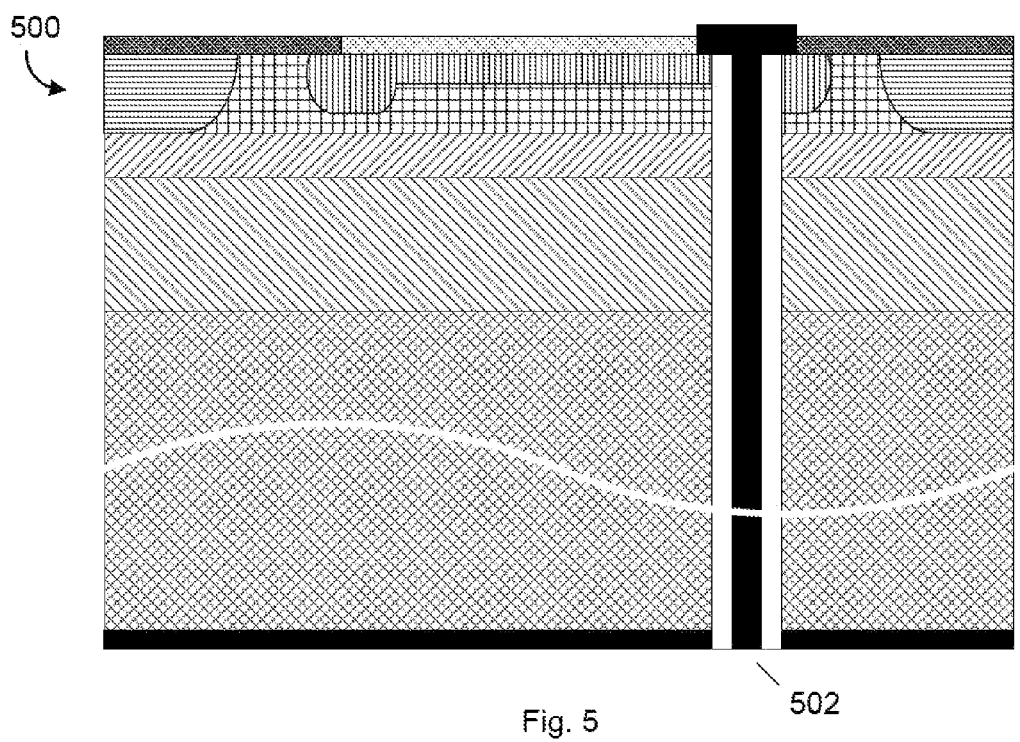
FIG. 5 depicts a fourth embodiment similar to the first embodiment shown in FIG. 1E with a backside via to the anode on the frontside.

FIG. 5 depicts a fourth embodiment 500 that adds a backside contact to an APD having similar structure as the first embodiment except that instead of having a frontside anode electrode, the anode electrode may make contact to the anode of the p-n junction through via 502. The cathode electrode may then be formed on the backside of handle wafer 308. The backside via of the fourth embodiment may also be used with other embodiments of an APD. For example, using the backside via as depicted in FIG. 5 may be particularly useful with the third embodiment if the insulating layer between the bonded wafers is not being used.

The third embodiment of an APD may be particularly useful in arrays of APDs. Typically, in APD arrays, it is desirable to detect when each APD adsorbs a photon independently from the other APDs. This requires that each APD in an array have at least one detection line that allows external circuits to determine when that APD has absorbed a photon. If the array has a large number of APDs, these lines may occupy a significant portion of the surface area of the array. By moving these lines to the backside of the array, the array may be smaller or may have more area available for the APDs to collect photons. The third embodiment as depicted in FIG. 3F or 4 or the fourth embodiment as depicted in FIG. 5 is particularly suited for an array with backside lines because in contrast to the first and second embodiments of FIGS. 1E and 2 with common backside contacts, each APD will have its own individual backside contact.

Figure 6:
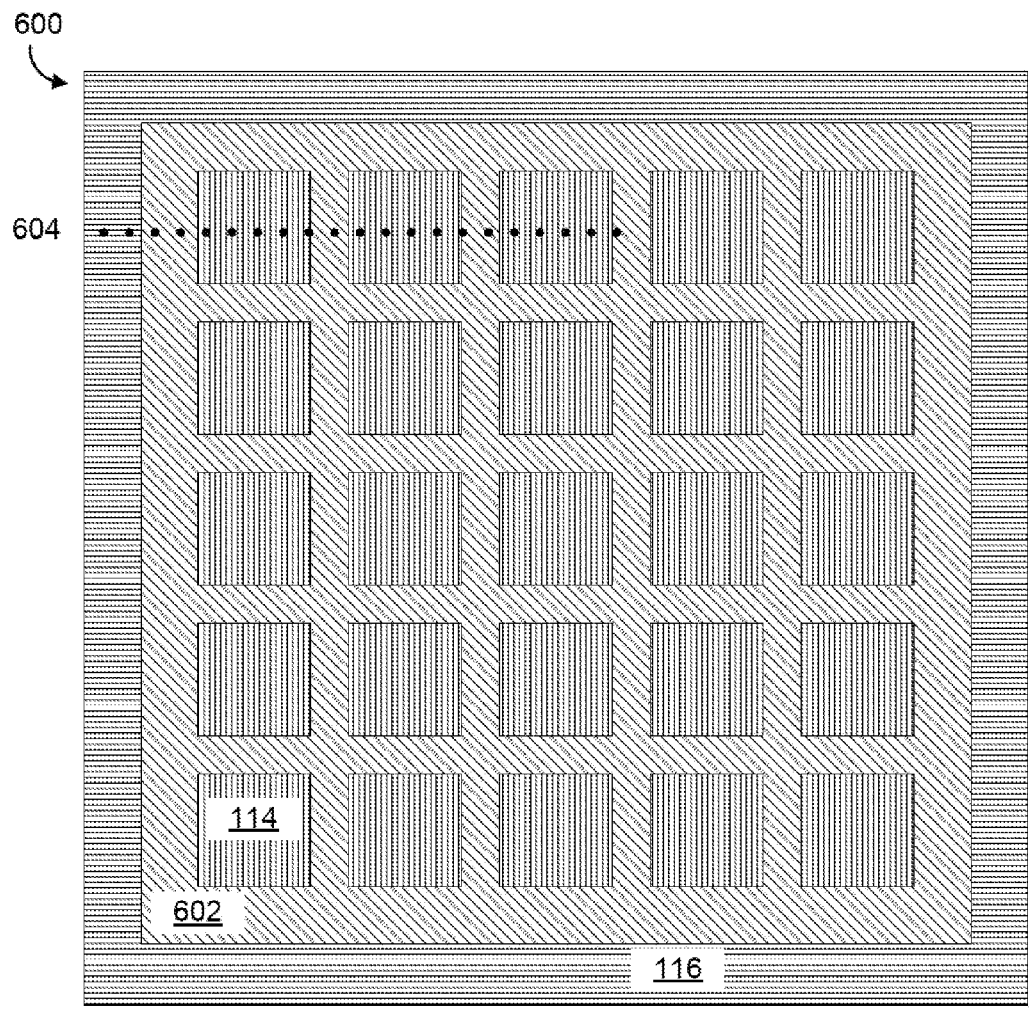
FIG. 6 depicts a top-view of a 5×5 array of APDs.

FIG. 6 depicts the top view of 5×5 array 600 of APDs with a structure similar to the third embodiment except the anode electrode, insulating layer, and anti-reflective layer have been omitted from the surface for clarity of illustration. Each APD is defined by region 114 that helps define the multiplication region. The top down view also shows region 602 which is the region with a doping level defined by the doping of wafer 100 (FIG. 1A). Channel stop region 116 is also shown. FIG. 7 is a cross-section of 5×5 array 600 through cut line 604 (FIG. 6). Arrays of up 100×100 or larger are also possible. Each APD has a discrete p-n junction 700, 702, and 704 that vertically overlaps a discrete buried implant region 706, 708, and 710 respectively.

What is claimed is:

1. An avalanche photodiode (APD) comprising:
  a first semiconductor substrate having a first doping type;
  a first semiconductor layer on top of the first semiconductor substrate, wherein the first semiconductor layer is doped with the first doping type;
  a second epitaxial layer on top of the first semiconductor layer, wherein the second epitaxial layer is in-situ doped with the first doping type at a concentration higher than a concentration of the first doping type in the first semiconductor layer;
  a third epitaxial layer on top of the second epitaxial layer, wherein the third epitaxial layer is in-situ doped with a second doping type, wherein the doping of the third epitaxial region forms a first p-n junction with the doping of the second epitaxial layer, wherein a carrier multiplication region includes the first p-n junction, and wherein the third epitaxial layer forms an absorption region for photons; and
a first implanted region within the third epitaxial layer, wherein the implanted region is doped with the second doping type.

2. The APD of claim 1, wherein the first semiconductor layer is a first epitaxial layer and is in-situ doped with the first doping type.

3. The APD of claim 1, wherein the first semiconductor layer is a second semiconductor substrate that is bonded to the first semiconductor substrate.

4. The APD of claim 1, wherein the first doping type is n-type and the second doping type is p-type and the semiconductor substrate is made of silicon.

5. The APD of claim 1 further comprising:
a second implanted region of the first doping type overlapping portions of the second epitaxial layer and the third epitaxial layer, the second implanted region forming a second p-n junction with the first implanted region.

6. The APD of claim 3, wherein the first or second semiconductor substrate has an insulating layer on a surface that is bonded to the second or first semiconductor substrate, respectively.

7. The APD of claim 6 further comprising:
a buried implant region in the second semiconductor substrate, wherein the buried implant region is adjacent the bonded surface of the second semiconductor substrate, wherein the buried implant region is doped with the first doping type.

8. The APD of claim 4 further comprising:
an anode electrode electrically contacting the first implanted region on a top surface of the third epitaxial layer; and
a cathode electrode electrically contacting the semiconductor substrate on the bottom surface of the semiconductor substrate.

9. The APD of claim 8, wherein the cathode electrode is biased higher than the anode electrode.

10. A process for fabricating an avalanche photodiode, the process comprising:
provisioning a semiconductor wafer having a first doping type;
growing a first epitaxial layer on top of the semiconductor wafer, wherein the first epitaxial layer is in-situ doped with the first doping type;
growing a second epitaxial layer on top of the first epitaxial layer, wherein the second epitaxial layer is in-situ doped with the first doping type at a concentration higher than a concentration of the first doping type in the first epitaxial layer;
growing a third epitaxial layer on top of the second epitaxial layer, wherein the third epitaxial layer is in-situ doped with a second doping type, wherein the third epitaxial layer forms a first p-n junction with the second epitaxial layer, wherein a carrier multiplication region includes the first p-n junction, and wherein the third epitaxial layer forms an absorption region; and
implanting a first region within the third epitaxial layer with ions of the second doping type.

11. The process of claim 10, wherein an epitaxy chamber grows the first, second, and third epitaxial layers and wherein the first, second, and third epitaxial layers are grown at once in the epitaxy chamber.

12. The process of claim 10 further comprising:
implanting a second region in the second epitaxial layer with ions of the first doping type, wherein the second region is implanted prior to growing the third epitaxial layer and wherein the second region forms a second p-n junction with the first region.

13. The process of claim 10, wherein the first doping type is n-type and the second doping type is p-type and the semiconductor wafer is made of silicon.

14. The process of claim 13, further comprising:
forming an anode electrode on top of the third epitaxial layer, wherein the anode electrode electrically contacts the first region:
forming a cathode electrode on bottom of the semiconductor wafer.

15. A process for fabricating an avalanche photodiode, the process comprising:
provisioning a first wafer;
provisioning a second semiconductor wafer having a first doping type;
bonding the first wafer to the second semiconductor wafer;
thinning the second semiconductor wafer;
growing a first epitaxial layer on top of the second semiconductor wafer, wherein the first epitaxial layer is in-situ doped with the first doping type at a concentration higher than a concentration of the first doping type in the second semiconductor wafer;
growing a second epitaxial layer on top of the first epitaxial layer, wherein the second epitaxial layer is in-situ doped with a second doping type, wherein the second epitaxial layer forms a first p-n junction with the first epitaxial layer, wherein a carrier multiplication region includes the first p-n junction, and wherein the second epitaxial layer forms an absorption region; and
implanting a first region within the second epitaxial layer with ions of the second doping type.

16. The process of claim 15, wherein an epitaxy chamber grows the first and second epitaxial layers and wherein the first and second are grown at once in the epitaxy chamber.

17. The process of claim 15 further comprising:
implanting a second region in the first epitaxial layer with ions of the first doping type, wherein the second region is implanted prior to growing the second epitaxial layer and wherein the second region forms a second p-n junction with the first region.

18. The process of claim 15, wherein the first doping type is n-type and the second doping type is p-type and the second semiconductor wafer is made of silicon.

19. The process of claim 15, wherein the first wafer is bonded to the second semiconductor wafer through an insulating layer that, prior to the bonding step, was either part of the first wafer or the second semiconductor wafer.

20. The process of claim 18, further comprising:
forming an anode electrode on top of the second epitaxial layer, wherein the anode electrode electrically contacts the first region:
forming a cathode electrode on bottom of the first wafer.

21. An array of avalanche photodiodes, the array comprising:
a first semiconductor substrate having a first doping type, a first surface, and a second surface;
a second substrate having a first surface and a second surface, wherein the first surface of the second substrate is bonded with the second surface of the first semiconductor substrate;
an electrically insulating interface at the bond between the first semiconductor substrate and the second substrate, wherein prior to bonding the insulating layer was part of either the first semiconductor substrate or the second substrate;

a plurality of discrete buried implant regions at the second side of the first substrate, the implant regions being of the first doping type;

a plurality of discrete p-n junctions forming a plurality of carrier multiplication regions in the first substrate, wherein each of the p-n junctions vertically overlaps a different implant region of the plurality of discrete buried implant regions and wherein each of the p-n junctions is adjacent an absorption region; and a plurality of first vias through the second substrate, wherein each of the first vias contact a different implant region of the plurality of discrete buried implant regions.

22. The array of claim 21, wherein the plurality of first vias contain a metal.

23. The array of claim 21 further comprising:
a plurality of second vias through the second substrate, wherein each of the second vias contact a different implant region of the plurality of discrete buried implant regions and wherein each of the second vias contain a high resistance material thereby acting as a passive quench.

24. The array of claim 21 further, wherein each of the p-n junctions are reversed biased.

25. The array of claim 21, wherein the first doping type is n-type and the second doping type is p-type and the semiconductor substrate is made of silicon.

26. A process for fabricating an array of avalanche photodiodes, the process comprising:
provisioning a first semiconductor wafer being doped with a first doping type and having a first surface and a second surface opposite the first surface;
implanting ions of a first doping type into the second surface of the first semiconductor wafer to form a plurality of discrete implant regions;
provisioning a second wafer having a first surface and a second surface opposite the first surface;
forming a insulating layer on the second surface of the first semiconductor wafer or the first surface of the second wafer;
bonding the second surface of the first semiconductor wafer to the first surface of the second wafer, wherein the insulating layer is between the first semiconductor wafer and the second wafer;
forming a plurality of discrete p-n junctions to form a plurality of carrier multiplication regions in the first semiconductor wafer, wherein each of the p-n junctions vertically overlaps a different implant region of the plurality of discrete implant regions and wherein each of the p-n junctions is adjacent an absorption region;
etching a plurality of first vias through the second wafer, wherein each of the first vias terminate at a different implant region of the plurality of discrete implant regions;
depositing a fill material in the plurality of first vias.

27. The process of claim 26, wherein the fill material is a metal.

28. The process of claim 26 further comprising:
etching a plurality of second vias through the second wafer, wherein each of the second vias terminate at a different implant region of the plurality of discrete implant regions.

29. The process of claim 26, wherein the first doping type is n-type and the second doping type is p-type and the semiconductor wafer is made of silicon.

30. An array of avalanche photodiodes, the array comprising:
a semiconductor substrate having a first doping type;
a plurality of discrete p-n junctions forming a plurality of carrier multiplication regions in the semiconductor substrate, wherein each p-n junction has a top region forming one side of the p-n junction that is located adjacent a top surface of the semiconductor substrate and wherein the top region has doping of a second type;
a plurality of vias through the semiconductor substrate, wherein each of the vias electrically contact a different top region of a different p-n junction of the plurality of discrete p-n junctions and wherein each via is partially lined with an insulating layer; and
an electrode formed on a bottom surface of the semiconductor substrate, wherein the electrode electrically contacts the semiconductors substrate.

31. The array of claim 30, wherein the p-n junctions are reverse biased.

32. The array of claim 30, wherein the first doping type is n-type and the second doping type is p-type and the semiconductor substrate is made of silicon.

33. A process for fabricating an array of avalanche photodiodes, the process comprising:
provisioning a semiconductor wafer having a first doping type;
forming a plurality of discrete p-n junctions to form a plurality of carrier multiplication regions in the semiconductor substrate, wherein each p-n junction has a top region forming one side of the p-n junction that is located adjacent a top surface of the semiconductor substrate and wherein the top region has doping of a second type;
etching a plurality of first vias through the a semiconductor wafer, wherein each of the vias electrically contact a different top region of a different p-n junction of the plurality of discrete p-n junctions and wherein each via is partially lined with an insulating layer;
depositing a metal in the plurality of first vias.

34. The process of claim 33, wherein the first doping type is n-type and the second doping type is p-type and the semiconductor wafer is made of silicon.

* * * * *